United States Patent [19]

Kong

[11] Patent Number: 4,714,877
[45] Date of Patent: Dec. 22, 1987

[54] THREE-VOLTAGE LEVEL DETECTOR FOR INDICATING A HIGH LEVEL, MID-LEVEL OR LOW LEVEL VOLTAGE

[75] Inventor: Samuel K. Kong, Union City, Calif.

[73] Assignee: Advanced Micro Devices, Inc., Sunnyvale, Calif.

[21] Appl. No.: 803,467

[22] Filed: Dec. 2, 1985

[51] Int. Cl.$^4$ ............................................. G01R 19/14
[52] U.S. Cl. ..................................... 324/133; 324/72.5
[58] Field of Search ............... 324/133, 96, 122, 73 R, 324/72.5, 158 P, 134, 135; 340/660–663, 501, 511, 505; 307/360, 530, 473, 445, 463, 455, 354; 361/86, 90–92

[56] References Cited

U.S. PATENT DOCUMENTS

| | | | |
|---|---|---|---|
| 1,744,840 | 1/1930 | Strieby et al. | 324/133 X |
| 3,122,729 | 2/1964 | Bothwell et al. | 340/661 X |
| 3,267,375 | 8/1966 | Olsen | 340/661 X |
| 3,673,588 | 6/1972 | Riff | 324/133 X |
| 3,959,791 | 5/1976 | Takahashi et al. | 340/661 X |
| 4,011,508 | 3/1977 | Gabor | 324/133 |
| 4,348,661 | 9/1982 | Lucchesi | 340/511 X |
| 4,491,968 | 1/1985 | Shimp et al. | 340/661 X |
| 4,623,799 | 11/1986 | Nyman, Jr. | 307/473 X |
| 4,638,247 | 1/1987 | Ishikawa | 324/73 R |

Primary Examiner—Reinhard Eisenzopf
Assistant Examiner—Warren S. Edmonds
Attorney, Agent, or Firm—Patrick T. King; Davis Chin; J. Vincent Tortolano

[57] ABSTRACT

A three-voltage level detector include an input terminal for receiving an input logic signal having either a high level, mid-level or low level voltage. A first level sensing buffer is responsive to the input logic signal for generating a first output sense voltage indicative of whether the input logic signal is either at the (a) high level voltage or (b) mid-level or low level voltage. A second level sensing buffer is responsive to the input logic signal for generating a second output sense voltage indicative of whether the input logic signal is either at the (a) high level or mid-level voltage or (b) low level voltage. Logic gate circuits are responsive to the first and second output sense voltages for generating at a first output terminal of the detector a first output signal being in a high level only when the input logic signal is at the high level voltage, at a second output terminal of the detector a second output signal being in a high level only when the input logic signal is at the low level voltage, at a third output terminal of the detector a third output signal being in a high level only the input logic signal is at the mid-level voltage.

16 Claims, 2 Drawing Figures

THREE-VOLTAGE LEVEL DETECTOR FOR INDICATING A HIGH LEVEL, MID-LEVEL OR LOW LEVEL VOLTAGE

BACKGROUND OF THE INVENTION

This invention relates generally to digital output circuits and more particularly, it relates to a three-voltage level detector which senses three different input logic levels.

Three-voltage level detectors are generally used in connection with various electronic circuitry in computer systems. In one such application, the three-voltage level detector of the present invention is utilized as a location identifier in a 64-bit shifter.

SUMMARY OF THE INVENTION

It is a general object of the present invention to provide a three-voltage level detector which is relatively simple and economical to manufacture and assembly.

It is another object of the present invention to provide a three-voltage level detector formed of a first level sensing buffer, a second level sensing buffer, and three output logic gates.

It is another object of the present invention to provide a three-voltage level detector which includes a first level sensing buffer for sensing the mid-point between a high level voltage and a mid-level voltage and a second level sensing buffer for sensing the mid-point between the mid-level voltage and a low level voltage.

It is still another object of the present invention to provide a three-voltage level detector which includes an AND logic, a NOR logic gate, and an exclusive OR logic gate for generating respective first, second and third output signals in response to an input logic signal having three different voltage levels.

It is yet still another object of the present invention to provide a three-voltage level detector which is composed entirely of bipolar transistors.

In accordance with these aims and onjectives, the present invention is concerned with the provision of a three-voltage level detector which includes an input node for receiving an input logic signal having either a high level, mid-level or low level voltage. The level detector also includes a first level sensing buffer and a second level sensing buffer. The first level sensing buffer is responsive to the input logic signal for generating a first output sense voltage indicative of whether the input logic level is either at the (1) high level voltage or (2) mid-level or low level voltage. The second level sensing buffer is responsive to the input logic signal for generating a second output sense voltage indicative of whether the input logic signal is either at the (1) high level or mid-level voltage or (2) low level voltage. First, second and third logic gate circuits are responsive to the first and second output sense voltages. The first logic gate circuit generates a first output signal which is in a high level only when the input logic signal is at the high level voltage. The second logic gate circuit generates a second output signal which is in a high level only when the input signal is at the low level voltage. The third logic gate circuit generates a third output signal which is in a high level only when the input logic signal is at the mid-level voltage.

BRIEF DESCRIPTION OF THE DRAWINGS

These and other objects and advantages of the present invention will become more fully apparent from the following detailed description when read in conjunction with the accompanying drawings with like reference numerals indicating corresponding parts throughout, wherein.

DESCRIPTION OF THE PREFERRED EMBODIMENTS

Figure 1:
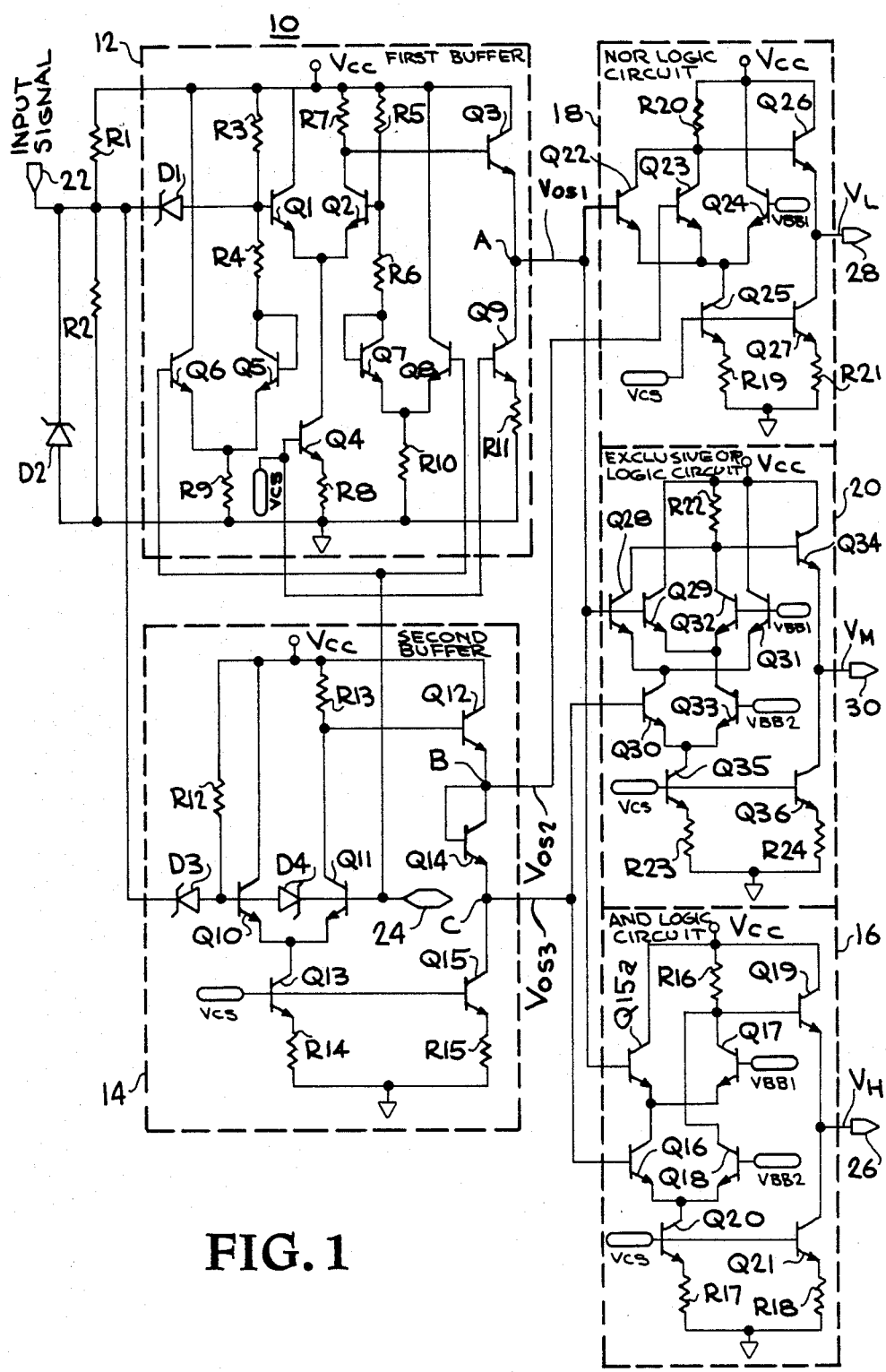
FIG. 1 is a schematic circuit diagram of a three-voltage level detector constructed in accordance with the principles of the present invention.

Referring now in detail to the drawings, there is shown in FIG. 1 a schematic circuit diagram of a three-voltage level-detector 10 constructed in accordance with the principles of the present invention. The three-voltage level detector 10 is comprised of a first level sensing buffer 12, a second level sensing buffer 14, a first output logic circuit 16, a second output logic circuit 18, and a third output logic circuit 20.

The first level sensing buffer 12 includes a Schottky diode D1 having its cathode connected to an input terminal 22 for receiving an applied input logic signal which is either at a logic "1" (high) level or a logic "0" (low) level. A voltage divider network is formed of resistors R1 and R2. One end of the resistor R1 is connected to one end of the resistor R2. The other end of the resistor R1 is connected to a supply voltage or potential VCC which is typically +5.0 volts for emitter-coupled logic (ECL) circuits. The other end of the resistor R2 is connected to a ground potential. The junction of the resistors R1 and R2 is also connected to the cathode of the diode D1. By selecting the resistors R1 and R2 to be of equal resistance values, a voltage of mid-level intermediate the high level and the low level is applied to the input of the first buffer 12 at the cathode of the diode D1 when the input terminal 22 is left open or is caused to "float".

The first level sensing buffer 12 further includes a differential amplifier formed of a pair of NPN-type bipolar transistors Q1 and Q2 having their emitters coupled together. The transistor Q1 defining an input transistor has its collector connected to the supply potential VCC and its base connected to the anode of the diode D1. The transistor Q2 defining a reference transistor has its collector connected to the supply potential VCC via a load resistor R7 and to the base of an emitter follower transistor Q3 of the NPN-type. The base of the reference transistor Q2 is connected to one end of a resistor R5 and to one end of a resistor R6 forming a junction which defines a reference voltage VSENSE1. The reference VSENSE1 is selected to be one voltage drop VSD of a Schottky diode above the mid-point between the high level input and the mid-level input by choosing the ratio of the resistors R5 and R6. The common emitters of the transistor Q1 and Q2 are joined to a constant current source formed of a transistor Q4 and a resistor R8. The collector of the transistor Q4 is tied to the emitters of the transistors Q1 and Q2. The emitter of the transistor Q4 is tied to one end of the resistor R8, and the other end of the resistor R8 is tied to the ground potential.

The base of the input transistor Q1 is also connected to one end of a resistor R3 and to one end of a resistor R4. The other end of the resistor R3 is connected to the supply potential VCC, and the other end of the resistor R4 is connected to the collector and base of a diode-connected transistor Q5. The emitter of the transistor Q5 is joined to the emitter of a transistor Q6 and to one end of a resistor R9. The collector of the transistor Q6 is tied to the supply potential VCC, and the other end of the resistor R9 is tied to the ground potential. The other end of the resistor R5 is connected to the supply potential VCC, and the other end of the resistor R6 is connected to the collector and base of a diode-connected transistor Q7. The emitter of the transistor Q7 is joined to the emitter of a transistor Q8 and to one end of a resistor R10. The other end of the resistor R10 is tried to the ground potential. The bases of the transistor Q6 and Q8 are connected to an input terminal 24 for receiving an input reference voltage VSENSE IN. The reference voltage VSENSE IN is supplied from a variable voltage regulator (not shown) which tracks with the supply potential VCC. As can be seen, the voltages at the collectors of the transistors Q5 and Q7 will also be equal to this reference voltage VSENSE IN.

Thus, the reference voltage VSENSE1 at the base of the reference transistor Q2 is determined by the voltage difference (obtained by subtracting the input reference voltage VSENSE IN from the supply potential VCC) multiplied by the ratio of R6/(R5+R6). As previously pointed out, by selecting the appropriate resistance values for the resistors R5 and R6 the reference voltage VSENSE1 will be one Schottky voltage drop VSD above the mid-point between the high and mid-level input levels. While this reference voltage VSENSE1 has been derived from the input reference voltage VSENSE IN in this preferred embodiment, it should be understood that the reference voltage VSENSE1 may be generated separately by another reference source. The voltage at the base of the transistor Q1 is determined by the ratio of the resistors R3 and R4. The values of these resistors R3 and R4 are chosen so that when the transistor Q1 is turned on the voltage at its base is limited to be one-half of the swing higher than the voltage at the base of the transistor Q2. This prevents the voltage at the base of the transistor Q1 from charging to the supply potential.

The emitter follower transistor Q3 has its collector connected to the supply potential VCC and its emitter connected to a node A defining the output of the first level sensing buffer 12 for producing an output sense voltage VOS1. The emitter of the transistor Q3 is also connected to a constant current formed of a transistor Q9 and a resistor R11. The collector of the transistor Q9 is connected to the emitter of the transistor Q3 and the emitter of the transistor Q9 is connected to one end of the resistor R11. The other end of the resistor R11 is connected to the ground potential. The bases of the transistors Q4 and Q9 are connected to a reference voltage source VCS. A second Schottky diode D2 is connected between the input terminal 22 and the ground potential for protecting the level detector 10 against excessive negative voltages.

The second level sensing buffer 14 includes a Schottky diode D3 having its cathode connected also to the input terminal 22 for receiving the same applied input signal which was fed to the first buffer 12. The cathode of the diode D3 defining the input of the second buffer 14 is likewise connected to the junction of the resistors R1 and R2 for receiving the mid-level voltage when the input terminal 22 is "floating".

The second level sensing buffer 14 further includes a differential amplifier formed of a pair NPN-type bipolar transistors Q10 and Q11 having their emitters coupled together. The transistor Q10 defining an input transistor has its collector connected to the supply potential VCC and its base connected to anode of the diode D3. The base of the input transistor Q10 is also connected to one end of a resistor R12. The other end of the resistor R12 is tied to the supply potential VCC. The transistor Q11 defining a reference transistor has its collector connected to the supply potential via a resistors R13 and to the base of an emitter follower transistor Q12 of the NPN-type. A Schottky diode D4 has its cathode connected to the base of the reference transistor Q11 and its anode connected to the base of the input transistor Q10. The base of the reference transistor Q11 is tied to the input terminal 24 for receiving the input reference voltage VSENSE IN. The input reference voltage VSENSE IN is selected to be one voltage drop VSD of a Schottky diode above the mid-point between the low level input and the mid-level input. The common emitters of the transistors Q10 and Q11 are joined to a constant current source formed of a transistor Q13 and a resistor R14. The collector of the transistor Q13 is joined to the common emitters of the transistors Q10 and Q11. The emitter of the transistor Q13 is connected to one end of the resistor R14, and the other end of the resistor R14 is connected to the ground potential.

The emitter follower transistor Q12 has its collector connected to the supply VCC and its emitter connected to the collector and base of a transistor Q14 functioning as a diode. The emitter of the transistor Q14 is connected to a constant current source formed of a transistor Q15 and a resistor R15. The emitter of the transistor Q14 is connected to the collector of the transistor Q15, and the emitter of the transistor Q15 is joined to one end of the resistor R15. The other end of the resistor R15 is joined to the ground potential. The bases of the transistors Q13 and Q15 are connected to the reference voltage source VCS. The emitter of the transistor Q12 at node B defines a first output of the second buffer 14 for producing an upper output sense voltage VOS2. The emitter of the transistor Q14 at node C defines a second output of the second buffer 14 for producing a lower output sense voltage VOS3 which is one diode drop below the upper output sense voltage VOS2.

The first output logic circuit 16 is comprised of an AND logic gate which includes a first input transistor Q15a and a second input transistor Q16. The input transistor Q15a has its base coupled to the output sense voltage VOS1 of the first buffer 12, its collector connected to the supply potential VCC, and its emitter connected to the emitter of a first reference transistor Q17. The reference transistor Q17 has its base connected to a first reference bias voltage VBB1 and its collector connected to the supply potential VCC via load resistor R16 and to the base of an emitter follower transistor Q19. The second input transistor Q16 has its collector connected to the common emitters of the transistor Q15a and Q17, its base coupled to the lower output sense voltage VOS3 of the second buffer 14, and its emitter connected to the emitter of a second reference transistor Q18. The second reference transistor Q18 has its collector connected to the junction of the resistor R16 and the base of the emitter follower transistor Q19 and its base connected to a second reference bias voltage VBB2. A constant current source formed of a transistor Q20 and a resistor R17 is joined to the common emitters of the transistor Q16 and Q18. The emitter follower transistor Q19 has its collector connected to the supply potential VCC and its emitter connected to an output terminal 26 for producing a first output voltage VH. The emitter of the transistor Q19 is also connected to a constant current source formed of a transistor Q21 and resistor R18. The bases of the transistors Q20 and Q21 are joined to the reference voltage source VCS.

The second output logic circuit 18 is comprised of a NOR logic gate which includes a first input transistor Q22, a second input transistor Q23, and a reference transistor Q24 whose emitters are all connected together and to a constant current source formed of a transistor Q25 and a resistor R19. The reference transistor Q24 has its collector tied to the supply potential VCC and its base connected to the first reference bias voltage VBB1. The collectors of the input transistor Q22 and Q23 are joined together and further connected to the supply potential VCC via a load resistor R20. The base of the first input transistor Q22 is connected to the output sense voltage VOS1 of the first buffer 12, and the base of the second input transistor Q23 is connected to the upper output sense voltage VOS2 of the second buffer 14. The common collectors of the transistors Q22 and Q23 are also connected to the base of an emitter follower transistor Q26. The transistor Q26 has its collector tied to the supply potential and its emitter connected to an output terminal 28 for producing a second output voltage VL. The emitter of the transistor Q26 is also connected to a constant current source formed of a transistor Q27 and a resistor R21. The bases of the transistor Q25 and Q27 are joined to the reference voltage source VCS.

The third output logic circuit 20 is comprised of an exclusive OR gate which includes a first input transistor Q28, a second input transistor Q29, a third input transistor Q30, a first reference transistor Q31, a second reference transistor Q32, and a third reference transistor Q33. The emitters of the transistors Q28 and Q31 are connected together and to the collector of the transistor Q30. The collector of the first reference transistor Q31 is connected to the supply potential VCC, and the collector of the first input transistor Q28 is also connected to the supply potential via a resistor R22. The bases of the first and second input transistors Q28, Q29 are joined to the output sense voltage VOS1 of the first buffer 12, and the bases of the first and second reference transistors Q31, Q32 are connected to the first reference bias voltage VBB1. The emitters of the transistors Q29 and Q32 are connected together and to the collector of the third reference transistor Q33. The collector of the second input transistor Q29 is connected to the supply potential VCC, and the collector of the second reference transistor Q32 is also connected to the supply potential via the resistor R22. The collectors of the transistors Q28 and Q32 are also tied to the base of an emitter follower transistor Q34. The emitters of the transistors Q30 and Q33 are coupled to a constant current source formed of a transistor Q35 and a resistor R23. The base of the third input transistor Q30 is connected to the lower output sense voltage VOS3 of the second buffer 14. The base of the third reference transistor Q33 is connected to the second reference bias voltage VBB2. The transistor Q34 has its collector connected to the supply potential and its emitter connected to an output terminal 30 for producing a third output voltage VM. The emitter of the transistor Q34 is also joined to a constant current source formed of a transistor Q36 and a resistor R24. The bases of the transistors Q35 and Q36 are joined to the reference voltage source VCS.

Figure 2:
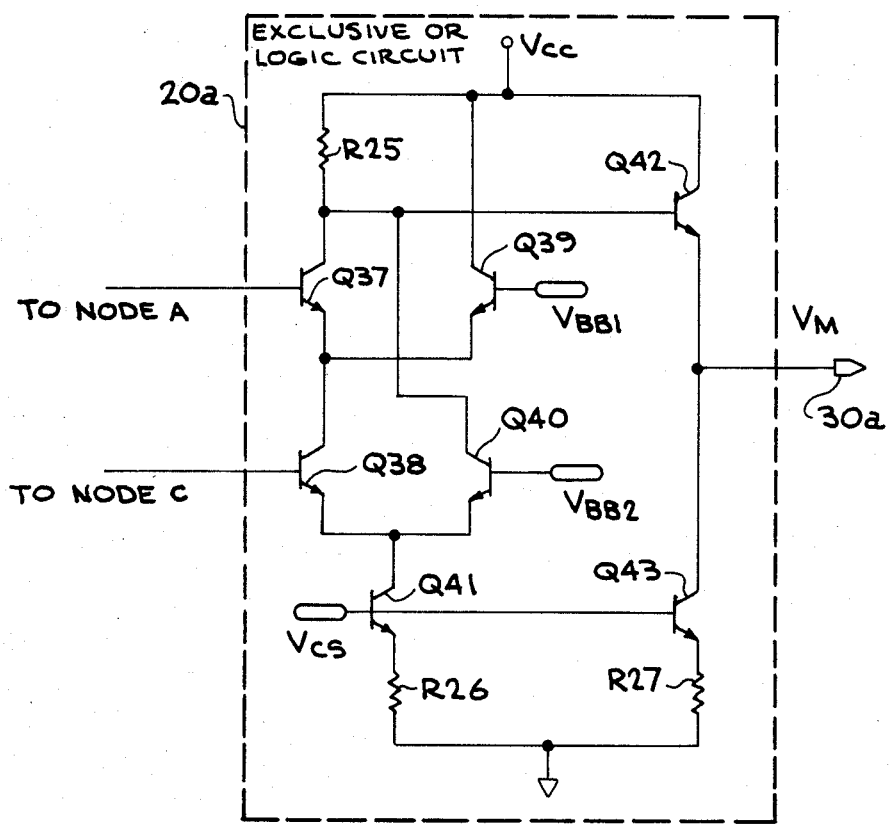
FIG. 2 is a detailed circuit of an alternate embodiment of the exclusive OR logic gate in FIG. 1.

An alternate embodiment of an exclusive OR logic gate 20a is shown in FIG. 2 which uses a fewer number of bipolar transistors. The logic gate 20a includes a first input transistor Q37, a second input transistor Q38, a first reference transistor Q39, and a second reference transistor Q40. The emitters of the transistors Q37 and Q39 are connected together and to the collector of the second input transistor Q38. The collector of the first input transistor Q39 is connected to the supply potential VCC, and the collector of the first input transistor Q37 is connected to the supply potential via a load resistor R25. The base of the first input transistor Q37 is connectable to the node A of FIG. 1 for receiving the output sense voltage VOS1 of the first buffer 12, and the base of the first reference transistor Q39 is connected to the first reference bias voltage VBB1. The emitters of the transistors Q38 and Q40 are coupled together and to a constant current source formed of a transistor Q41 and a resistor R26. The collector of the second reference transistor Q40 is connected to the collector of the first input transistor Q37 and to the base of an emitter follower transistor Q42. The base of the second input transistor Q38 is connectable to the node C of FIG. 1 for receiving the lower output sense voltage VOS3 of the second buffer 14, and the base of the second reference transistor Q40 is connected to the second reference bias voltage VBB2. The transistor Q42 has its collector connected to the supply potential and its emitter connected to a output terminal 30a for producing the third output voltage VM. The emitter of the transistor Q42 is also connected to a constant current source formed of a transistor Q43 and a resistor R27. The bases of the transistors Q41 and Q43 are tied to the reference voltage VCS.

Referring back to FIG. 1, the operation of the three-voltage level detector 10 will now be described. Assume first that the applied first input signal is in a "high"-'level. Under this condition, the input transistor Q1 in the first buffer 12 will be turned on and the reference transistor Q2 will be turned off. Thus, there will be no voltage drop across the load resistor R7 and the voltage at the base of the emitter follower transistor Q3 will be higher which renders it more conductive. As a result, the output sense voltage VOS1 from the first buffer 12 will be at a "high" level. Also, the input transistor Q10 in the second buffer 14 will be turned on and the reference transistor Q11 will be turned off. Consequently, there will be no voltage drop across the load resistor R13 and the voltage at the base of the emitter follower transistor Q12 will be higher causing it to be more conductive. This, in turn, causes the upper and lower output sense voltages VOS2 and VOS3 to be in a "high" level.

In the AND logic gate 16, the voltage VOS1 of a "high" level is applied to the base of the first input transistor Q15a and the voltage VOS3 of a "high" level is applied to the base of the second input transistor Q16. This causes the transistors Q15a and Q16 to be turned on which turns off the respective transistors Q17 and Q18. As a result, there will be no voltage drop across the resistor R16 and the voltage at the base of the emitter follower transistor Q19 will be high. Consequently, the first output voltage VH will be at a "high" level. Turning now to the NOR logic gate 18, the voltage VOS1 of a "high" level is applied to the base of the first input transistor Q22 and the voltage VOS2 of a "high"

level is applied to the base of the second input transistor Q23. This causes the transistors Q22 and Q23 to be turned on and the reference transistor Q24 to be turned off. As a result, there will be a voltage drop across the load resistor R20 which will lower the voltage at the base of the emitter follower transistor Q26. Consequently, the second output voltage VL will be at a "low" level. Referring to the exclusive OR logic gate 20, the voltage VOS1 of a "high" level is applied to the bases of the first and second input transistors Q28, Q29 and the voltage VOS3 of a "high" is applied to the base of the third input transistor Q30. This cause the transistors Q28, Q29 and Q30 to be turned on and the transistors Q31, Q32 and Q33 to be turned off. Thus, there will be a voltage drop across the load resistor R22 which lowers the voltage at the base of the emitter follower transistor Q34. Consequently, the third output voltage VM will be at a "low" level.

As can be seen from this operation just described, when the input logic signal of a "high" level is applied to the level detector 10 the output sense voltages VOS2 and VOS3 of the second buffer 14 will be in a "high" level and the output level VOS1 of the first buffer 12 will also be in a "high" level. As a result, only the first output voltage VH from the AND logic gate 16 will be in a "high" level indicating the sensing of a "high" level in the input logic signal.

Now assume that the applied input logic signal is in the "low" level. Using a similar analysis as previously done above, it can be shown that the output sense voltage VOS1 from the first buffer 12 will be in a "low" level and the output sense voltage VOS2 and VOS3 from the second buffer 14 will be in a "low" level. Further, only the second output voltage VL from the NOR logic gate 18 will be in a "high" level indicating the sensing of a "low" level in the input logic signal.

Now assume that the applied input logic signal is at the mid-level voltage between the "low" level and the "high" level (at the mid-point thereof). Again, using a similar analysis it can be shown that the output sense voltage VOS1 from the first buffer 12 will be in a "low" level and the output sense voltages VOS2 and VOS3 from the second buffer 14 will be in a "high" level. Further, only the third output voltage VM from the exclusive OR logic gate 20 will be in a "high" level indicating the sensing of a mid-level in the input logic signal. When the exclusive OR logic gate 20a of FIG. 2 is used, it will function in the same manner as the logic gate 20.

In summary, the first level sensing buffer 12 generates the output sense voltage VOS1 which indicates whether the applied input logic signal is at (1) a "high" level or (2) a mid-level voltage or "low" level. The output sense voltage VOS1 will be a "high" level when the applied input logic signal is at a "high" level and will be at a "low" level when the applied input logic signal is at either a mid-level voltage or a "low" level. The second level sensing buffer 14 generates the output sensing voltages VOS2 and VOS3 which indicate whether the applied input logic signal is at (1) a "high" level or mid-level voltage or (2) a "low" level. The voltages VOS2 and VOS3 will be at a "high" level when the applied input logic signal is either at "high" level when the applied input logic signal is either at "high" level or mid-level voltage and will be at a "low" when the applied input logic signal is at a "low" level.

Each of the first, second and third logic gates 16, 18 and 20 are responsive to the outputs of the first and second level sensing buffers 12, and 14. Only the first output voltage VH of the logic gate 16 will have a "high" level when the applied input logic signal is at a "high" level. Similarly, only the second output voltage VL of the logic gate 18 will have "high" level when the applied input logic signal is at a "low" level. Finally, only the third output voltage VM of the logic gate 20 will have a "high" level when the applied input logic signal is at a mid-level voltage.

While all of the transistors in the three-voltage detector of the present invention have been shown as NPN-type bipolar transistors, it should apparent to those skilled in the art that they could be replaced with PNP-type bipolar transistors or MOS transistors. Further, the level detector of the instant invention may be formed on a single silicon semiconductor chip of a monolithic integrated circuit.

From the foregoing detailed description, it can thus be seen that the present invention provides a three-voltage level detector for generating first, second and third output signals in response to three different voltage levels for an input logic signal which includes a first level sensing buffer for generating a first output sense voltage and a second level sensing buffer for generating a second output sense voltage. Further, there are provided an AND logic, a NOR logic gate, and an exclusive OR logic gate for generating the respective first, second and third output signals indicating the level of the input logic signal.

While there has been illustrated and described what are at present to be considered preferred embodiments of the present invention, it will be understood by those skilled in the art that various changes and modifications may be made, and equivalents may be substituted for elements thereof without departing from the true scope of the invention. In addition, many modifications may be made to adapt a particular situation or material to the teachings of the invention without departing from the central scope thereof. Therefore, it is intended that this invention not be limited to the particular embodiments disclosed as the best modes contemplated for carrying out this invention, but that the invention will include all embodiments falling within the scope of the appended claims.

What is claimed is:

1. A three-voltage level detector comprising:
   input means for receiving at an input terminal of the detector an input logic signal having either a high level, mid-level or low level voltage;
   first level sensing buffer means responsive to said input logic signal for generating a first output sense voltage indicative of whether said input logic signal is either at the (a) high level voltage or (b) mid-level or low level voltage;
   said first sensing means including a differential amplifier formed of first and second bipolar transistors having their emitters coupled together, said first transistor defining an input transistor and having its base coupled to said input logic signal, said second transistor defining a reference transistor and having its base coupled to a first sensing voltage;
   second level sensing means responsive to said input logic signal for generating a second output sense voltage indicative of whether said input logic signal is either at the (a) high level or mid-level voltage or (b) low level voltage;
   first logic means responsive to said first and second output sense voltages for generating at a first output terminal of the detector a first output signal being in a high level only when said input logic level is at the high level voltage;

second logic means responsive to said first and second output sense voltages for generating at a second output terminal of the detector a second output signal being in a high level only when said input logic level is at the low level voltage; and third logic means responsive to said first and second output sense voltages for generating at a third output terminal of the detector a third output signal being in a high level only when said input logic level is at the mid-level voltage.

2. A three-voltage level detector as claimed in claim 1, wherein said first sensing voltage is equal to one diode voltage drop above the mid-point of the high level voltage and the mid-level voltage.

3. A three-voltage level detector as claimed in claim 2, wherein said second sensing means includes a second differential amplifier formed of third and fourth bipolar transistors having their emitters coupled together, said third transistor defining an input transistor and having its base coupled to said input logic signal, said fourth transistor defining a reference transistor and having its base coupled to a second sensing voltage.

4. A three-voltage level detector as claimed in claim 3, wherein said second sensing voltage is equal to one diode voltage drop above the mid-point of the mid-level voltage and the low level voltage.

5. A three-voltage level detector as claimed in claim 1, wherein said first and second transistors are of the NPN-type conductivity.

6. A three-voltage level detector as claimed in claim 3, wherein said third and fourth bipolar transistors are of the NPN-type conductivity.

7. A three-voltage level detector as claimed in claim 1, wherein said first logic means comprises an AND logic gate formed of NPN-type bipolar transistors.

8. A three-voltage level detector as claimed in claim 1, wherein said second logic means comprises a NOR logic gate formed of NPN-type bipolar transistors.

9. A three-voltage level detector as claimed in claim 1, wherein said third logic means comprises an exclusive OR logic gate formed of NPN-type bipolar transistors.

10. A three-voltage level detector comprising:

input means for receiving at an input terminal of the detector an input logic signal having either a high level, mid-level or low level voltage;

first level sensing buffer means responsive to said input logic signal for generating first output sense voltage indicative of whether said input logic signal is either at the (a) high level voltage or (b) mid-level or low level voltage;

said first sensing means including a differential amplifier formed of first and second bipolar transistors having their emitters coupled together, said first transistor defining an input transistor and having its base coupled to said input logic signal, said second transistor defining a reference transistor and having its base coupled to a first sensing voltage;

second level sensing buffer means responsive to said input logic signal for generating a second output sense voltage indicative of whether said input logic signal is either at the (a) high level or mid-level voltage or (b) low level voltage; and gating means responsive to said first and second output sense voltages for generating at a first output terminal of the detector a first output signal being in a high level only when said input logic signal is at the high level voltage, at a second output terminal of the detector a second output signal being in a high level only when said input logic signal is at the low level voltage, and at a third output terminal of the detector a third output signal being in a high level only when said input logic signal is at the mid-level voltage.

11. A three-voltage level detector as claimed in claim 10 wherein said first sensing voltage is equal to one diode voltage drop above the mid-point of the high level voltage and the mid-level voltage.

12. A three-voltage level detector as claimed in claim 11, wherein said second sensing means includes a second differential amplifier formed of third and fourth bipolar transistors having their emitters coupled together, said third transistor defining an input transistor and having its base coupled to said input logic signal, said fourth transistor defining a reference transistor and having its base coupled to a second sensing voltage.

13. A three-voltage level detector as claimed in claim 12, wherein said second sensing voltage is equal to one diode voltage drop above the mid-point of the mid-level voltage and the low level voltage.

14. A three-voltage level detector as claimed in claim 13, wherein said gating means comprises an AND logic gate formed of NPN-type bipolar transistors.

15. A three-voltage level detector as claimed in claim 14, wherein said gating means further comprises a NOR logic gate formed of NPN-type bipolar transistors.

16. A three-voltage level detector as claimed in claim 15, wherein said gating means further comprises an exclusive OR logic gate formed of NPN-type bipolar transistors.

* * * * *